US010658159B2

United States Patent
Shojaei et al.

(10) Patent No.: US 10,658,159 B2
(45) Date of Patent: May 19, 2020

(54) PLASMA REACTOR VESSEL HAVING IMPROVED PLASMA UNIFORMITY COMPRISED OF A FIRST ELECTRODE, A SECOND ELECTRODE OPPOSED TO THE FIRST ELECTRODE, AND A THIRD ELECTRODE BETWEEN A SUBSTRATE CARRIER AND THE SECOND ELECTRODE

(71) Applicant: Indeotec SA, Neuchatel (CH)

(72) Inventors: Omid Reza Shojaei, Lausanne (CH); Jacques Schmitt, Yevre le Chatel (FR); Fabrice Jeanneret, Fleurier (CH)

(73) Assignee: INDEOTEC SA, Neuchatel (CH)

( * ) Notice: Subject to any disclaimer, the term of this patent is extended or adjusted under 35 U.S.C. 154(b) by 1016 days.

(21) Appl. No.: 14/916,214

(22) PCT Filed: Sep. 25, 2014

(86) PCT No.: PCT/EP2014/070542
§ 371 (c)(1),
(2) Date: Mar. 3, 2016

(87) PCT Pub. No.: WO2015/044295
PCT Pub. Date: Apr. 2, 2015

(65) Prior Publication Data
US 2016/0196959 A1  Jul. 7, 2016

(30) Foreign Application Priority Data

Sep. 27, 2013 (EP) .................... 13186529

(51) Int. Cl.
*H01J 37/32* (2006.01)
*C23C 16/509* (2006.01)

(52) U.S. Cl.
CPC ...... *H01J 37/32568* (2013.01); *C23C 16/509* (2013.01); *H01J 37/3244* (2013.01);
(Continued)

(58) Field of Classification Search
CPC ......... C30B 25/00; C30B 25/02; C30B 25/12; C23C 16/44; C23C 16/50; C23C 16/503;
(Continued)

(56) References Cited

U.S. PATENT DOCUMENTS 4,969,676 A  11/1990 LaMagna
5,066,340 A  11/1991 Iwamoto et al.
(Continued)

FOREIGN PATENT DOCUMENTS

EP        2333814 A2   6/2011
KR    20080020722 A   3/2008

OTHER PUBLICATIONS

International Search Report and Written Opinion for PCT/EP2014/070542, dated Nov. 3, 2014, 12 pages.

*Primary Examiner* — Kenneth A Bratland, Jr.
(74) *Attorney, Agent, or Firm* — Blank Rome LLP

(57) ABSTRACT

Plasma reactor vessel comprising a vacuum chamber; a first electrode in the vacuum chamber; a second electrode in the vacuum chamber, opposed to the first electrode and spaced from the first electrode; a power source electrically connected to one of the first or second electrodes; a substrate carrier having an electrically conductive material, the substrate carrier being configured to be in electrical contact with the second electrode and to hold a substrate at such that at least the majority of upper and lower surfaces of the substrate are untouched by any part of the plasma reactor and can be exposed to the plasma. The reactor vessel further includes a third electrode between the substrate carrier and the second electrode, wherein the third electrode is electrically insulated from the second electrode. And the third electrode and the substrate carrier are arranged such that when the substrate carrier holds a substrate, a first clearance gap is between the substrate and the third electrode. There is
(Continued)

further provided a corresponding assembly and method for performing plasma processing.

11 Claims, 8 Drawing Sheets

(52) U.S. Cl.
CPC .. *H01J 37/32091* (2013.01); *H01J 37/32403* (2013.01); *H01J 37/32577* (2013.01); *H01J 37/32715* (2013.01); *H01J 37/32889* (2013.01); *H01J 37/32899* (2013.01); *H01J 2237/327* (2013.01); *H01J 2237/3321* (2013.01)

(58) Field of Classification Search
CPC .............. C23C 16/505; H01J 2237/327; H01J 2237/3321; H01J 37/32568; H01J 37/32091; H01J 37/32403; H01J 37/3244; H01J 37/32577; H01J 37/32715; H01J 37/32889; H01J 37/32899

USPC .... 117/84, 88, 103, 200, 204; 118/715, 722, 118/723 R, 723 E, 724–725, 728

See application file for complete search history.

(56) References Cited

U.S. PATENT DOCUMENTS

| | | | |
|---|---|---|---|
| 5,981,899 A * | 11/1999 | Perrin | H01J 37/32541 118/723 R |
| 6,095,084 A * | 8/2000 | Shamouilian | C23C 16/00 118/723 E |
| 6,207,890 B1 | 3/2001 | Nakai et al. | |
| 2008/0061041 A1* | 3/2008 | Nishijima | H01J 37/32091 219/121.48 |
| 2009/0294062 A1* | 12/2009 | Shannon | H01J 37/32091 156/345.24 |
| 2010/0282709 A1 | 11/2010 | Kang et al. | |
| 2013/0112546 A1 | 5/2013 | Brown et al. | |

* cited by examiner

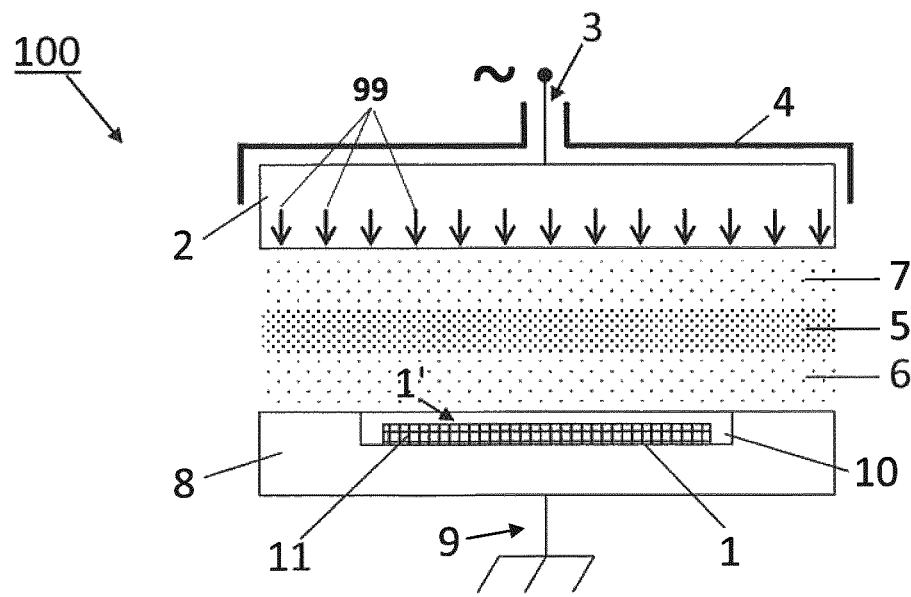
Fig. 1 (prior art)
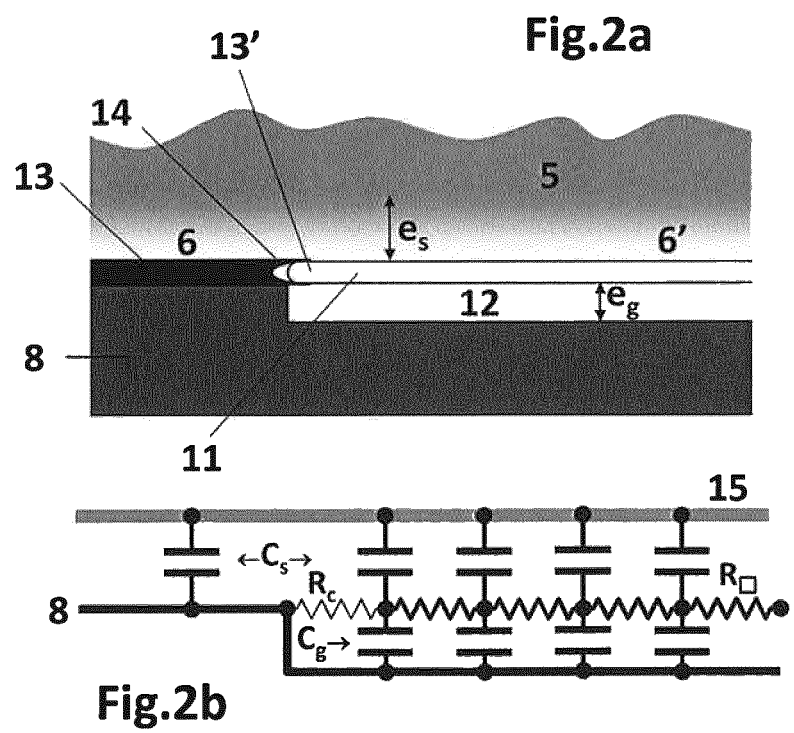

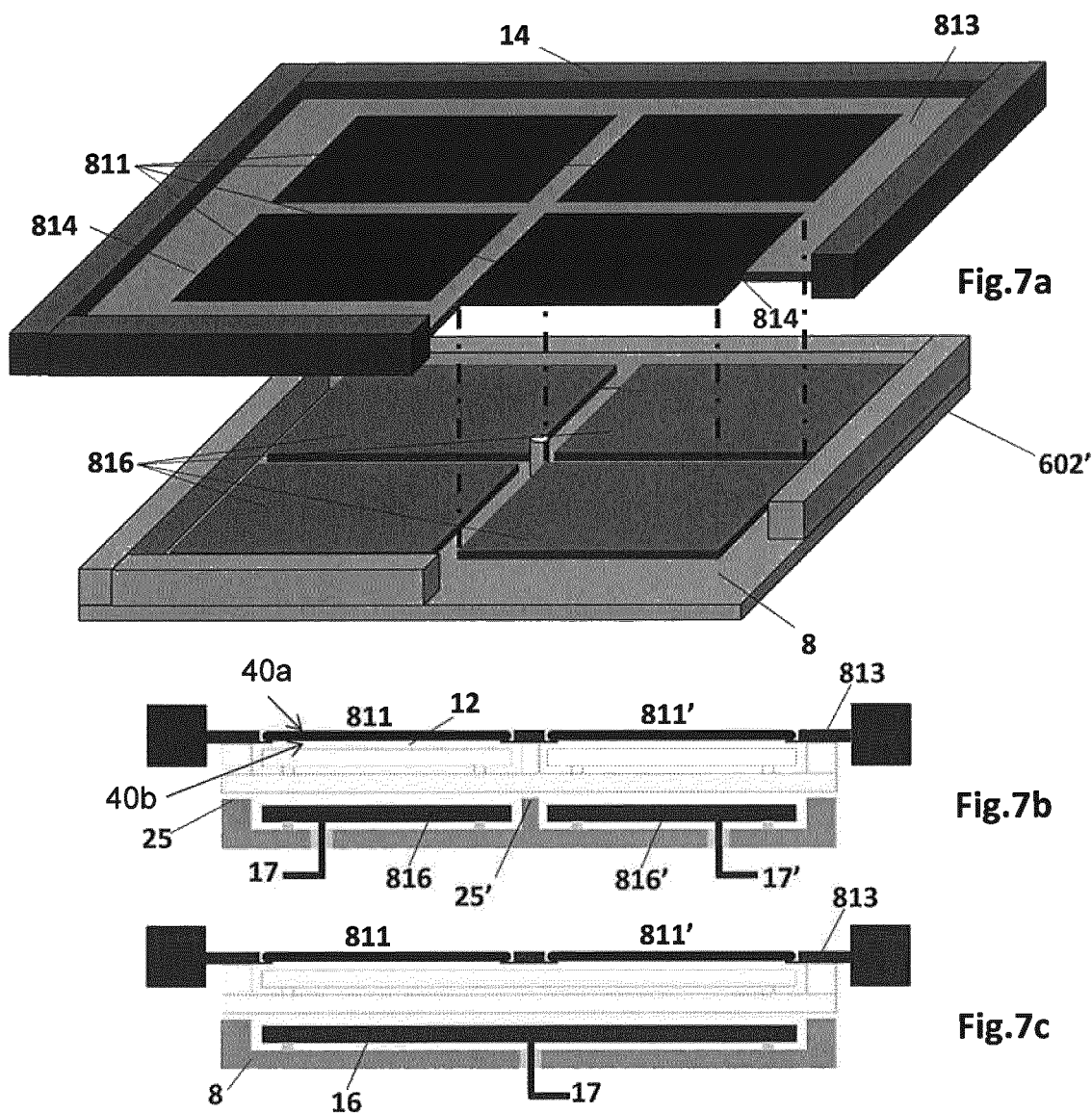

PLASMA REACTOR VESSEL HAVING IMPROVED PLASMA UNIFORMITY COMPRISED OF A FIRST ELECTRODE, A SECOND ELECTRODE OPPOSED TO THE FIRST ELECTRODE, AND A THIRD ELECTRODE BETWEEN A SUBSTRATE CARRIER AND THE SECOND ELECTRODE

RELATED APPLICATIONS

This application is a national phase of PCT/EP2014/070542, filed on Sep. 25, 2014, which claims the benefit of European Application No. 13186529.7, filed on Sep. 27, 2013. The entire contents of those applications are incorporated herein by reference.

FIELD OF THE INVENTION

The present invention concerns a plasma reactor vessel which can be used to perform plasma deposition on a substrate, the plasma reactor vessel comprising three electrodes, and a substrate carrier which is configured to hold substrate so that a majority of the substrates upper and lower surfaces remain untouched by the substrate carrier or any other part of the plasma reactor vessel. There is further provided a plasma reactor assembly and a method of performing plasma processing.

DESCRIPTION OF RELATED ART

FIG. 1 illustrates a conventional plasma capacitor processing reactor 100. A first planar electrode comprises a metallic plate 2 facing a substrate 11. The first electrode 2 is fed with RF voltage via an inlet 3, and surrounded by a grounded liner 4. Modern PECVD reactors deliver their process gas through the first electrode as represented by distributed arrows 99. A second electrode of the parallel plate capacitor is the metallic back-plate 8, on which the substrate 11 is laying in contact with the second electrode 8 by its face 1. As shown in FIG. 1, the substrate 11 can be inserted in a recess 10 provided in the back-plate 8 such that the exposed surface 11' of the substrate 11 remains sensibly in planar continuity with the surface of the back-plate 8 exposed to the plasma 5. The recess 10 allows keeping the plasma boundary free of a geometrical step, although in many PECVD processing tool, the substrate merely lay flat on a flat back plate sometimes called susceptor (when it is provided with heat) or chuck (when it is forcing flat the wafer). The back-plate 8 is electrically connected to ground via connector 9. The RF inlet 3 and connector 9 can be inverted. Indeed, there is a degree of freedom on where the RF power is fed on both electrodes 2, 8, provided the potential difference between the electrodes 2, 8 is insured. For most conventional plasma processing, the delivered RF power is at the standard frequency of 13.56 MHz, but there is a trend to use higher frequency for silicon based PECVD (say up to 100 MHz). Plasma 5 is made of the ionized fraction of a low pressure background gas. For PECVD deposition, this plasma is made of reactive gases. The plasma 5 is located in the central zone of the plasma capacitor gap. In first approximation, the plasma slab 5 can be considered as a conductive block at a single given voltage called plasma potential which itself is the superposition of a DC component and an RF component. Within plasma boundaries 6, 7, or sheaths, the plasma free electron density drops dramatically and, at first order, the plasma boundaries 6, 7 can be considered as empty nonconductive layers crossed by the RF current in a capacitive manner. In a classical design the substrate 11 is laying in contact with the back-plate 8 and the spacing between the back side of the substrate 1 and the back-plate electrode 8 is virtually zero. Thank to that contact, the RF voltage of the substrate 11 is essentially the same as the one on the adjacent surface of the back-plate 8. It is implied here that the extra impedance associated to the RF current flow across the substrate is actually negligible. This mechanical contact at the spacing interface 1 provides good continuity of the voltage setting at the boundary of sheath 6. However, due to that contact, the substrate backside is actually in friction contact in several areas with the back-plate 8.

Because of the sensitivity of device performance to interface contamination, a standard processing technique consists in carefully cleaning the substrate (wet process) prior to its entry in the load lock of a low pressure process system. During the atmospheric transfer the substrate can be handled either by a contactless pick up device with Bernoulli effect as described in U.S. Pat. No. 4,969,676 or by grasping the substrate only in limited areas located on the very edge of the substrate, contact areas that are off limit for the active device. When the substrate is inside the low pressure processing equipment and when it is to be exposed to RF plasma, it is a standard practice to lay the substrate on a metallic counter plate in order to carefully set the voltage behind the substrate. Indeed, in a plasma capacitor, the RF current is flowing transversally to the parallel electrode plane and it is necessary to provide a grounding electrode and return path for the RF current traversing the substrate. The difficulty is that the physical contact between the substrate backside surface and the counter plate is enough to contaminate the substrate, transferring chemical contamination or particles. This contamination may jeopardize any further processing of the substrate back side. At this point, there are two options, the $1^{st}$ one is to bring back the substrate to atmosphere after coating one face, flip the substrate, clean thoroughly the backside and load again in the low pressure system to further process the other side of the substrate. As vacuum processing has a significant entry cost related to the time consumed in load-lock operation plus heating/cooling and degassing, such a process sequence with two passes in a vacuum system implies a high production cost. The $2^{nd}$ solution consists in accepting the risk of backside contamination and possibly degraded device performance. After deposition on the wafer top face while it is laid on a back plate, the internal handling system of the production tool flips the wafer and continues the process for the other side of the wafer. This is a process sequence as described in EP2333814. One should note that flipping a fragile material slice such as a thin silicon wafer is rather risky in terms of probability of breakage. One of the leading reasons for this breakage risk is due to the absence of atmospheric vibration damping.

The manufacture of hetero-junction cells is disclosed in U.S. Pat. Nos. 5,066,340 and 6,207,890. Basically the manufacturing process for hetero-junction cells start with a thin good quality crystalline or polycrystalline silicon wafer. The wafer can be moderately doped. In order to turn it into a photodiode, layers of amorphous silicon are deposited, with p doping on one side (boron doped) and n doping (phosphorus doped) on the opposite side. As a consequence, a photovoltaic heterojunction cell is grown from a silicon wafer. After PECVD growth, the initial open surfaces of the wafer are deeply embedded in the core of the device structure. From this it is easily understood that the device is very sensitive to any defect or impurity that would be initially attached to the wafer surfaces. Prior to the coating of the crystal silicon based wafer, it is of great importance that the wafer surface is extremely well cleaned. This cleaning incorporates at the end of the wet cleaning sequence a so-called etch/passivation process based on a hydrofluoric acid exposure. The HF based etch is known to remove the oxidized surface of the wafer and leave a hydrogen saturated surface of clean and perfectly organized silicon crystal. This hydrogen based passivation is known to survive a few minutes in clean air. Soon after, the silicon oxidizes again, and/or chemisorptions incorporate gaseous impurities on the semiconductor surface. This is why just after the last etch wet clean, the silicon substrate should be readily introduced in the load lock and kept inside a clean vacuum machine.

If a silicon wafer is introduced in a vacuum system and kept lying on a substrate holder or an electrostatic chuck, it will be in physical and chemical contact with its support. Because of this physical and chemical contact with its support there is a critical risk for contamination of the surface of the silicon wafer. Moreover it is advantageous if all the processes on both sides of the wafer are completed in one vacuum sequence; otherwise, if one side of the wafer is coated, when the substrate is brought back to air, the etch clean passivation of the other side will be damaged and will have to be performed again (with the risk of damaging by wet etching the wafer side already coated).

We will discuss here the rather straightforward solution consisting in keeping a clearance gap between the back of the substrate and the second electrode as back plate. FIG. 2a illustrates a portion of a plasma reactor comprising a first clearance gap 12 between a substrate 11 and the back electrode 8 and wherein the substrate 11 is held in a substrate carrier 13 in electrical contact with the electrode 8. In this configuration, the substrate backside is in mechanical contact with the electrode 8 solely via the edge contacts 13' with the substrate carrier 13. However the body of the substrate 11 is in capacitive relation with the electrode 8 facing its backside. The substrate upper surface is exposed to the plasma 5 comprising a plasma sheath 6. In this configuration, the RF current flowing transversely first crosses the plasma sheath 6 as a vacuum capacitor, then crosses the substrate 11. Here again, the resistance (or capacitive impedance) for the RF current to cross the substrate 11 is neglected. The RF current also must cross the extra capacitor constituted by the first clearance gap 12 or, possibly, flow horizontally in the substrate.

FIG. 2b represents an equivalent RF circuit of the plasma reactor shown in FIG. 2a. In the equivalent circuit, the plasma sheath 6' and the first clearance gap 12 are described by capacitors $C_s$ and $C_g$, respectively. Current transport along the surface of the substrate 11 is described by the resistive sheet $R_\square$ expressed in Ohm square. The plasma RF potential is represented by the conductive line 15. The contact resistance $R_c$ is representing the electric contact between the substrate 11 and the substrate carrier 13 at edge 13'. As the substrate holding scheme is arranged to minimize the contact surface at the very edge of the wafer, it is reasonable to assume that $R_c$ is very large and that only a negligible fraction of the RF current is flowing through the contact points, hence, in first approximation, we may consider the substrate as floating. In such a case the ratio of the driving voltage $V_{eff}$ across the plasma sheath 6' in front of the substrate to the full RF voltage difference $V_{RF}$ available between the plasma 5 and 15 and ground 8 and 13 can be calculated as in a classical capacitive divider via Equation (1):

$$V_{eff}/V_{RF}=e_s/(e_s+e_g) \quad (1),$$

where $e_s$ is an equivalent thickness of the plasma sheath 6' and $e_g$ is the width of the first clearance gap 12.

In a typical RF processing plasma $e_s$ is typically comprised between 1 mm and 4 mm. If $e_g$ is 1 mm, the ratio $V_{eff}/V_{RF}$ varies from 80% to 50%. The voltage along the plasma sheath when moving along the surface from sheath 6 in front of the electrode 8 (via the conductive substrate carrier 13) to sheath 6' in front of the substrate is experiencing a significant drop in driving RF voltage amplitude, thus the plasma is significantly non-uniform.

Would the contact points between the substrate 11 and the frame 13 be enough to collect a significant fraction of the RF current, then the horizontal conductivity of the substrate may transmit the RF voltage along the substrate with some damping due to sheet resistance. Such transmission can be described by the telegrapher's equation where a lateral perturbation of the voltage is damped exponentially on a scale L given by Equation (2):

$$L^2=2e_se_g/[\varepsilon_0\omega R_\square(e_s+e_g)] \quad (2)$$

The screening length L is an estimate of the distance on which the RF voltage will change from a pinning side contact to the floating case of Equation (1). It can be estimated for typical plasma processing condition, a frequency of 13.56 MHz, sheath thickness of 2 mm, and first clearance gap 12 of 1 mm. This scaling length is about 40 cm for a substrate square resistance of 10Ω, 13 cm for 100Ω, and 4 cm for 1000Ω. In a large range of substrate conductivity from 10 to 1000Ω square, the screening length is never significantly larger than the size of the substrate of interest; hence, in any case, the substrate horizontal conductivity is not able to equalize the RF voltage across the plasma sheath between the center and the edge of the substrate.

The consequence is that when a first clearance gap 12 is present between a substrate and the back electrode, the RF voltage in the plasma sheath 6' in front of the substrate is reduced significantly due to the first clearance gap that combines with the sheath to create a capacitive divider. The adjacent plasma zone has the full RF voltage across its sheath 6. It is recalled here that in standard plasma capacitors the RF sheath voltage provides the driving energy for the plasma, and that the resulting plasma density scales as the square of this RF voltage. As we have estimated that, in presence of the first clearance gap, the RF voltage ratio $V_{eff}/V_{RF}$ reduce to 80% or less, this implies that between the grounded edges and the central zone of a substrate, the plasma production intensity varies from 100% to 64% or less. As the electrons in the plasma are diffusing this plasma power non uniformity will smear laterally and a process non uniformity will stretch from the substrate edges toward the wafer central zone.

To summarize, one of the most obvious consequences of the existence of a clearance gap behind the substrate is poor process uniformity. In some cases this RF sheath voltage variation has even more drastic drawbacks. In particular for silane based PECVD processes, the stronger edge plasma will induce an early trigger for local excessive plasma dust formation. The trapping of the dust cloud in the local sheath will even further deteriorate plasma uniformity.

US2013112546 discloses a sputtering system having a processing chamber with an inlet port and an outlet port, and a sputtering target positioned on a wall of the processing chamber. There is also disclosed a plurality of processing chambers which are connected via a vacuum passage.

US2008061041 discloses a plasma treatment apparatus includes a first electrode, a second electrode provided so as to face the first electrode via the work so that a space is formed between the second electrode and the work, a gas supply unit which supplies a gas into the space, a power circuit having a power source which applies a high frequency voltage across the first and second electrodes so that the gas supplied into the space is converted into a plasma, and a support unit which supports at least a part of the second region of the work so that the work is spaced apart from the first electrode in a distance at which discharge does not occur between the first region and the first electrode when the high frequency voltage is applied across the first and second electrodes.

US2009294062 discloses a plasma reactor employing source and bias RF power generators, plasma is stabilized against an engineered transient in the output of either the source or bias power generator by a compensating modulation in the other generator.

US2010282709 discloses a substrate plasma-processing apparatus for plasma-processing a surface of an electrode of an organic light emitting device. The substrate plasma-processing apparatus may adjust the distance between a first electrode and a substrate and adjust the distance between a second electrode and the substrate.

KR20080020722 discloses a plasma processing apparatus is provided to improve uniformity of a plasma treatment process by generating a high discharge effect on the entire surface of a substrate. A plasma treatment process is performed in a process chamber. Upper and lower electrodes are installed in the process chamber, confronting each other. A gas supply member supplies process gas in a manner that a flow of the process gas is induced from the lateral surface of the circumference of the substrate loaded between the upper and the lower electrodes toward the center of the substrate.

SUMMARY

It is an aim of the present invention to obviate or mitigate at least some of the above-mentioned disadvantages.

One aim of the invention is to perform RF processing of both sides of a substrate in a single vacuum sequence.

Another aim of the invention is to eliminate contamination due to friction or contact on the active areas of the substrate, which can occur when the substrate surface is in contact with a back electrode.

Another aim is to avoid plasma non uniformity induced by a mechanical clearance between the substrate and the back plate electrode.

Another aim of the invention is to avoid mechanically flipping of the substrate under vacuum. Mechanical flipping of the substrate under vacuum implies a risk of wafer breakage.

The present invention achieves these aims by providing a plasma reactor vessel in which the active parts of the substrate remain untouched by the substrate holder or any other part of the plasma reactor vessel such as an electrode in the plasma reactor vessel.

The present invention achieves these aims by means of a plasma reactor vessel, which comprises, a vacuum chamber; a first electrode in the vacuum chamber; a second electrode in the vacuum chamber, opposed to the first electrode and spaced from the first electrode; a means for providing plasma in the vacuum chamber; a power source electrically connected to one of the first or second electrodes, for applying a main RF voltage to one of the first or second electrodes, the other electrode being grounded; a substrate carrier comprising an electrically conductive material, the substrate carrier being configured to be in electrical contact with the second electrode and to hold a substrate such that at least the majority of upper and lower surfaces of the substrate are untouched by any part of the plasma reactor and can be exposed to the plasma; wherein the reactor vessel further comprises a third electrode comprised between the substrate carrier and the second electrode, wherein the third electrode is electrically insulated from said second electrode; and wherein the third electrode is arranged such that, when the substrate carrier holds a substrate, a first clearance gap is comprised between the substrate and the third electrode.

The position of the third electrode and/or the position of the substrate carrier within the plasma reactor vessel may be adjustable, so that the size of the first clearance gap between the third electrode and a substrate held by the substrate holder may be adjustable. The plasma voltage at a surface of the substrate may be determined by the magnitude of the first clearance gap. The position of the third electrode and/or the position of the substrate carrier within the plasma reactor vessel may be adjusted to provide a predefined plasma voltage at the surface of the substrate.

Preferably the substrate carrier is configured to hold the substrate at a periphery of the substrate. The substrate carrier can be configured to hold the substrate at a periphery of the substrate such that an upper surface and lower surface of the substrate are completely exposed, or such that at least the majority of the upper and lower surfaces of the substrate are exposed. In that latter configuration, said at least the majority of the upper and lower surfaces of the substrate are untouched by the substrate carrier and/or by any part of the plasma reactor vessel. Preferably, the substrate carrier is configured to hold the substrate such that active areas of the upper and lower surfaces are not in contact with the substrate carrier. Here, the active areas correspond to the surface where devices are to be deposited. Preferably the substrate carrier is configured to hold the substrate within non-active parts of the substrate only. Non-active parts can comprise a distance of 0.5 mm to 2 mm, or 2 mm to 3 mm, or 0.5 mm to 10 mm at the periphery of the substrate surface.

Yet another aim of a favorable embodiment of the invention is to exploit a compensation RF voltage for exposing in single vacuum sequences both the upper and the lower surfaces of a substrate, without flipping the substrate and/or without touching the active areas of both faces of a substrate. To achieve this aim, the plasma reactor vessel may comprise a compensating device configured to provide a compensating RF voltage to the third electrode, the compensation RF voltage having a modulation phase opposite to the modulation phase of the RF voltage differential between the first and the second electrodes. The amplitude of the compensation RF voltage may be adjusted so that the amplitude of plasma voltage at a surface of the substrate may be substantially equal to the amplitude of voltage at one of said first or second electrode.

The first clearance gap between the third electrode and the substrate is substantially of constant thickness, this distance being comprised between 0.5 mm and 3 mm. Preferably the first clearance gap is less than 2 mm. Most preferably the gap is about 1 mm.

The present invention provides an assembly comprising a plurality of plasma reactor vessels, at least one of the plurality of plasma reactor vessels being a plasma reactor vessel according one of the above-mentioned plasma reactor vessels, wherein each of the plurality of plasma reactor vessels are connected via a vacuum passage, wherein the vacuum passages are configured to allow a substrate to pass, and wherein at least one of said plasma reactor vessels is configured to provide plasma at an upper surface of the substrate, at least one of said plasma reactor vessels is configured to provide plasma at a lower, opposite, surface of the substrate. It will be understood that the upper surface is a first surface of the substrate and the lower surface is the second surface of the substrate which is opposite to the first surface. Thus the upper and lower surfaces may lie on the same horizontal plane as described in the embodiment of FIG. 3, or may lie on the same vertical plane, or may lie on in any plane between the horizontal and vertical plane.

The present invention also relates to low pressure processing of a substrate that has active areas on both its upper and lower surfaces. The substrate is typically used to make an electronic, optical, electromechanical or electrochemical component. In most embodiments it is preferable that non-conductive substrates are used. It is also preferable that the substrates have a planar profile. Examples of substrates which can be used in the present invention include dielectric substrates, such as thin glass substrates for touch screen displays, or semiconductor wafers for power diodes or hetero-junction Silicon solar cells.

It is an objective of the present invention to provide a method of performing plasma processing on a substrate, uniformly and without touching active areas of the substrate. Also it is preferably that in a single vacuum sequence process the other side of the substrate be entirely processed.

This objective is achieved by means of a method for performing plasma processing using the reactor, comprising the steps of: arranging a substrate carrier to hold a substrate; introducing the substrate carrier which holds the substrate into the vacuum chamber; positioning the substrate carrier within the vacuum chamber so as to align an upper or lower surfaces of the substrate with the first and/or second electrode; moving the third electrode to provide a first clearance gap, of a predefined value, between the substrate and the third electrode; applying a main RF voltage to the one of the first or second electrode and grounding the other electrode; applying a compensating voltage to the third electrode, wherein the compensation voltage is opposite in phase to the RF voltage differential applied between the first or second electrodes; providing plasma in a gap which is between the substrate and the first or second electrode; and then igniting the plasma.

Other optional features of the invention are given in the dependent claims of this application.

BRIEF DESCRIPTION OF THE DRAWINGS

The invention will be better understood with the aid of the description of embodiments of the invention, which are given by way of example only, and illustrated by the figures, in which:

FIG. 1 illustrates a conventional plasma capacitor processing reactor;

FIG. 2 illustrates a portion of a conventional plasma reactor (FIG. 2a) comprising a recess behind the substrate providing a first clearance and an equivalent RF circuit (FIG. 2b);

FIGS. 7a-c show a perspective and cross-sectional views of the carrier and substrate assembly together with the second and third electrode assembly according to a further embodiment of the present invention;

DETAILED DESCRIPTION OF POSSIBLE EMBODIMENTS

Figure 3:
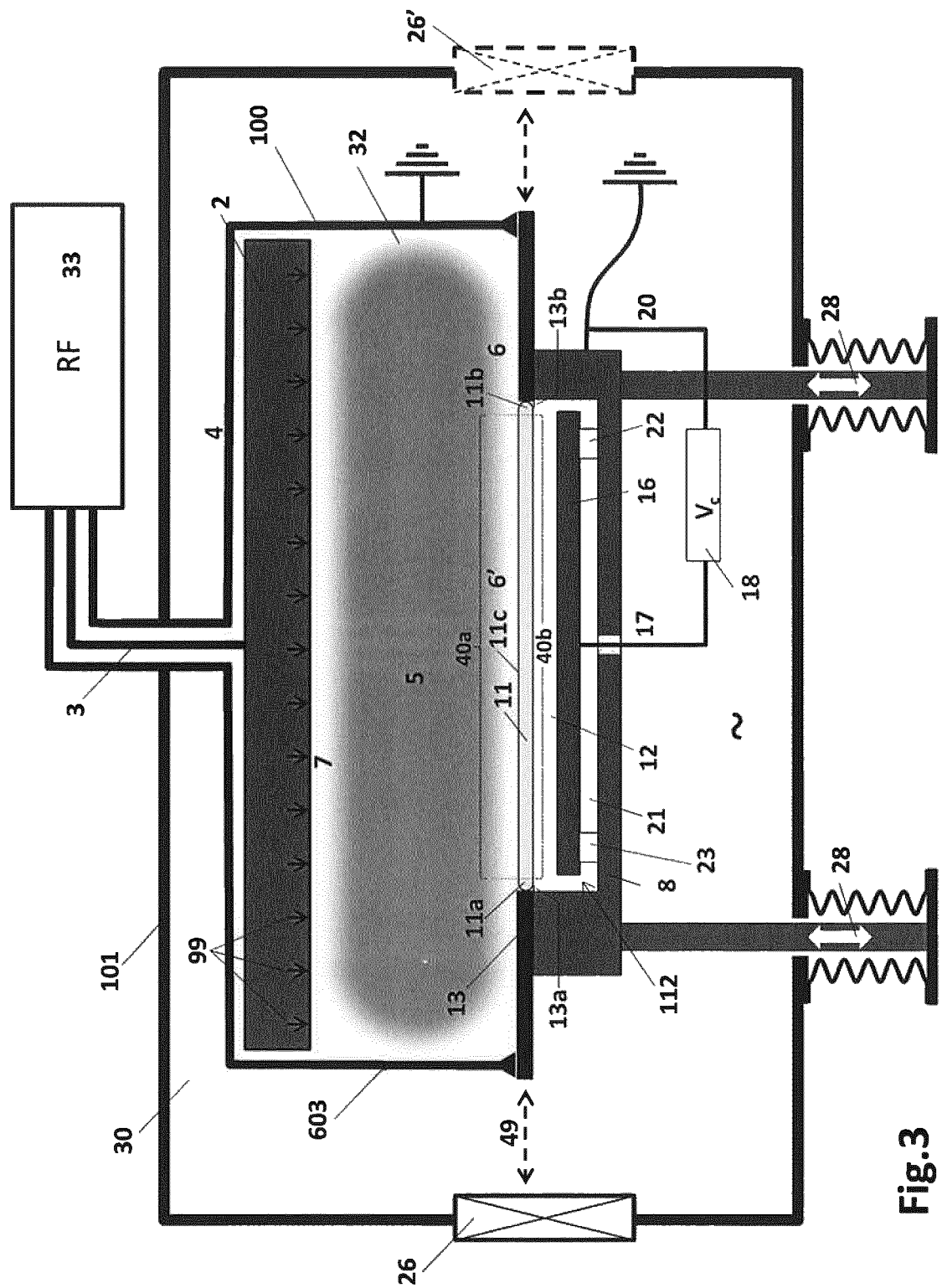
FIG. 3 shows a cross sectional view of a reactor vessel according to an embodiment of the present invention.

FIG. 3 shows a cross-sectional view of a plasma reactor vessel 100 according to an embodiment.

The plasma reactor vessel 100 comprises a vacuum chamber 30 enclosed in vacuum vessel 101; a plasma reactor volume 32 within the reactor ground walls 100, a first electrode 2 in the reactor volume 32; a second electrode 8 in the vacuum chamber 30, opposed to the first electrode 2, facing the reactor volume 32 and spaced from the first electrode 2.

A power source 33 is electrically connected to the first electrode 2 for applying a main RF voltage to the first electrode 2 such as to feed power to a plasma in the plasma reactor volume 32. The second electrode 8 is grounded. It will be understood that in another embodiment the power source 33 may be electrically connected to the second electrode 8, and the first electrode 2 may be grounded.

A substrate carrier 13 which comprises an electrically conductive material is further provided in the plasma reactor vessel 100. The substrate carrier 13 is configured so that it can be electrically connected with the second electrode 8 when substrate carrier 13 is positioned in the vacuum chamber 30. The substrate carrier 13 illustrated in FIG. 3 is shown to hold a substrate 11, such as a wafer. The substrate carrier 13 is configured to be removable from the vacuum chamber 30, to allow the substrate 11 to be mounted on the substrate carrier 13. The substrate carrier 13 holds at least one substrate 11 such that at least the majority of an upper 40a and opposite lower surface 40b of the substrate 11 are untouched by the substrate carrier 13 or any other part of the plasma reactor 100. In the example which is illustrated in FIG. 3 the substrate carrier 13 comprises support members 13a, 13b on which the substrate 11 rests; the length of the support members 13a, 13b are such that they extend along non-active parts 11a, 11b of the substrate 11 only; thus an active part 11c of the substrate 11 remains untouched by the support members 13a, 13b or any other part of the plasma reactor 100. It should be noted that the active part 11c of the substrate 11 is a part of the substrate which is exposed to the plasma 5 while the non-active parts 11a, 11b of the substrate are the parts of the substrate 11 which are in contact with the substrate carrier 13.

In a variant, the support members 13a, 13b further contact the upper surface of the substrate 11, that they extend along non-active parts 11a, 11b of the substrate 11 only. It will be understood that in another embodiment the substrate carrier 13 may hold the substrate 11 only at its periphery so that the whole of the upper and lower surfaces 40a, 40b of the substrate 11 remain untouched by the substrate carrier 13.

The reactor vessel 100 further comprises a third electrode 16 positioned between the substrate carrier 13 and the second electrode 8; such positioning of the third electrode 16 ensures that the third electrode 16 is located between the substrate 11 and the second electrode 8. The third electrode 16 and the substrate carrier 13 are positioned such that there is a first clearance gap 12 between the third electrode 16 and substrate 11. The first clearance gap 12 ensures that the substrate 11 is untouched by the third electrode 16. The first clearance gap 12 can be between 0.5 mm and 3 mm; preferably less than 2 mm; and most preferably about 1 mm. Preferably reactor vessel 100 comprises a means (not represented) by which the position of the third electrode 16 may be adjusted so that a user can select and provide any desired first clearance gap 12 between the substrate 11 and the third electrode 16.

The substrate carrier 13 may be configured such that the first clearance gap 12 remains constant along the entire surface of the substrate 11. For example, in the case the substrate 11 is very thin and bows due to gravity, electrode 16 can be curved in order to follow the shape of the bowed substrate 11 such as to keep the first clearance gap 12 constant.

The substrate carrier 13 can be further arranged such as to minimize possible geometric discontinuity at the intersection between the substrate carrier 13 and the substrate surface when the substrate 11 is held in the substrate carrier 13. For example, the support members 13a, 13b can be configured such that the active surface 11c of the substrate 11 is leveled with the substrate carrier 13 (see FIG. 3). In a variant not represented, the substrate carrier 13 can comprise symmetrically tapered edges narrowing towards the substrate 11. In this latter configuration, the intersection between the substrate carrier 13 and the substrate 11 may comprise a step.

Advantageously, since the substrate carrier 13 touches the substrate 11 only at the non-active areas 11a, 11b of the substrate 11, and since there is the first clearance gap 12 between the third electrode 16 and substrate 11, the active area 11c of the substrate 11 remains untouched by any part of the plasma reactor 100. Accordingly the active area 11c of the substrate 11 may be maintained uncontaminated.

In an embodiment, the vacuum vessel 101 further comprises a valve 26 destined to introduce the substrate carrier 13 in the vacuum vessel 101, for example in a direction indicated by arrow 49. The substrate carrier 13 can be inserted between the reactor body 100 and the second electrode 8. The vacuum vessel 101 can further comprises another valve 26', for example opposite to the valve 26, such as to allow the substrate carrier 13 to exit the vacuum vessel 101 at this other end.

In an embodiment, a compensating device 18 is electrically connected to the third electrode 16 by a feed line 17. It should be understood that the compensating device 18 may take any suitable configuration; example configurations will be discussed in more detail later. For this example the compensating device 18 may be considered as a simple RF voltage source.

The compensating device 18 is configured such that it can provide a compensating RF voltage $V_c$ to the third electrode 16, the compensation RF voltage having a modulation phase opposite to the modulation phase of the RF voltage differential between the first electrode 2 and second electrode 8. In the case the second electrode 8 is grounded, the RF voltage differential is equal to the main RF voltage which is applied by the power source 33 to the first electrode 2.

The compensating device 18 is also electrically connected by means of another connector line 20 directly to the second electrode 8 or indirectly to a metallic part in contact with electrode 8; thus the compensating device 18 is electrically connected between the second electrode 8 and the third electrode 16. As a result, in order for the third electrode 16 to be provided with a compensating RF voltage $V_c$, the compensating device 18 must provide the third electrode 16 with a compensation RF voltage $V_c$ whose phase and amplitude are adjusted so that the voltage of the substrate 11 takes the same value, by capacitive effect, than the value of the voltage on the second electrode 8.

The third electrode 16 is further electrically insulated from said second electrode 8 by means of insulating spacing elements 22, 23, such as ceramic holding pillars. The ceramic parts 22, 23 define a second clearance gap 21 between the third electrode 16 and the second electrode 8. The ceramic holding blocs 22, 23 may be replaceable with ceramic holding blocs of different dimension so as to enable a user to adjust the size of the second clearance gap 21. It will be understood that other means, beside ceramic holding blocs 22, 23 may be used to electrically insulate the third electrode 16 from the second electrode 8. Moreover, other means for adjusting the size of the second clearance gap 21 may be provided. In an embodiment, the second electrode 8 comprises a recess 112. The second clearance gap 21 may be configured to be of a predefined size by providing the second electrode 8 with the appropriate size recess and providing ceramic holding blocs 22, 23 with the appropriate dimensions.

In an embodiment, the reactor vessel 100 comprises mechanical actuators (shown by numeral 28 in FIGS. 3 and 5) adapted for moving the second electrode 8 and third electrode 16 (back plate assembly) relatively to the housing 603. This motion allows opening the plasma reactor volume 32 to the vacuum chamber 30 when the back plate assembly is lowered and closing it when the back plate assembly is moved upwards.

Figure 5A:
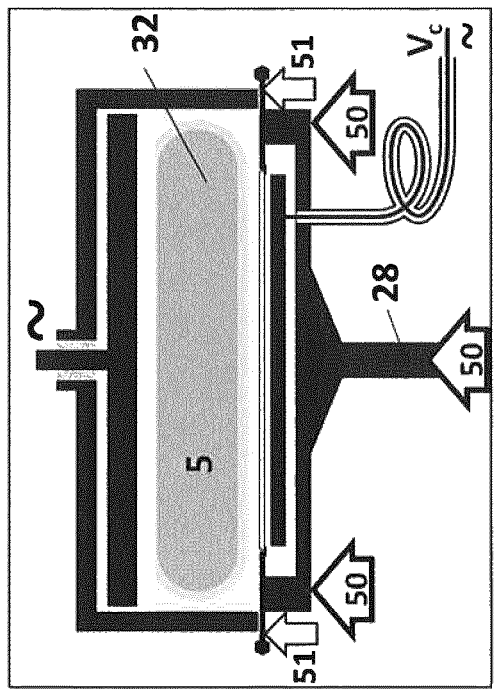
FIGS. 5a and b illustrate how the substrate carrier can be positioned in the reactor vessel of FIG. 3.
Figure 5B:
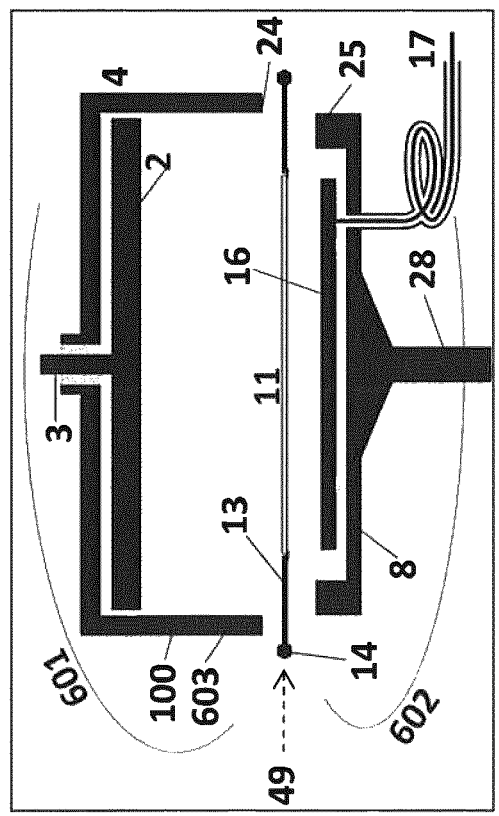

As can be best seen in FIGS. 5a and 5b, the reactor vessel 100 is divided into a first and second part 601, 602. The first part 601 comprises the first electrode 2 which is located within a housing 100. The second part 602 comprises the second electrode 8 and the third electrode 16 which are separated by the ceramic holding blocs 22, 23. Either the first or second part 601, 602 is moveable relative to the other part, for example by using the actuator 28. The substrate carrier 13 is positioned between the first and second part 601, 602. Preferably the substrate carrier 13 is moved in the direction of arrow 49, into position by means of robotic transport. The first and second parts 601, 602 are arranged so that they each are in abutment with the substrate carrier 13 so that the first and second parts 601, 602 and substrate carrier 13 define the plasma reactor volume 32. Specifically first and second parts 601, 602 are arranged so that the housing 100 is in abutment with the substrate carrier 13 and so that the second electrode 8 is in abutment with the substrate carrier 13. When the housing 100 is in abutment with the substrate carrier 13, the substrate carrier 13 can be pinched between the back plate assembly 8 and the housing 603. In a variant not represented, the substrate carrier 13 can move in the direction of arrow 49 when pinched.

It should be understood that in an alternative embodiment the first and second parts 601, 602 may be arranged so that they are no in abutment with the substrate carrier 13. In this case, the first and second parts 601, 602 are arranged so that there is a gap between each of the first and second parts 601, 602 and the substrate carrier 13. This gap may be used to supply or extract gas from the reaction vessel 100. In such configuration, the electrical contact between the second electrode 8 and the housing 603 can comprise a flexible ribbon (not shown) electrically connecting the housing 603 to the second electrode 8.

In practice the second part 602 of the reaction vessel 100 may be moved towards the first part 601 of the reaction vessel 100; or in alternative embodiments, the first part 601 of the reaction vessel 100 may be moved towards the second part 602 of the reaction vessel 100; or both the first and second parts 601, 602 may be moved towards one another; so as to clamp the substrate carrier 13 between the first and second parts 601, 602, thereby defining a plasma chamber in which a reactive process is applied to form the plasma reactor volume 32.

Figure 6A:
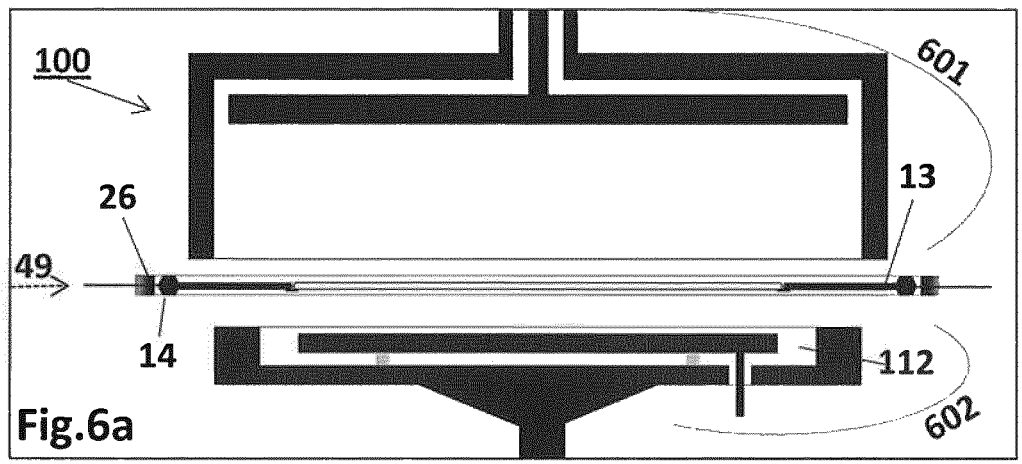
FIGS. 6 a-c show the substrate and carrier assembly in successive process position for coating successively both sides of the substrate.
Figure 6B:
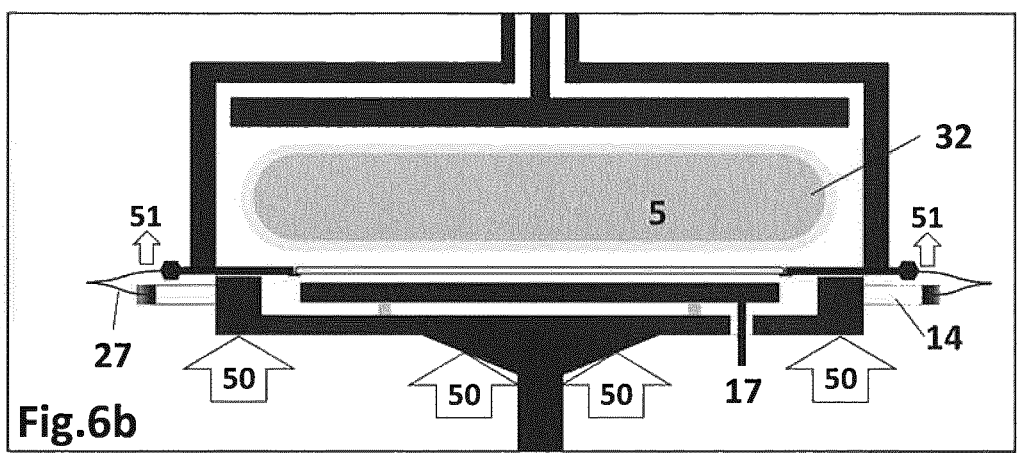
Figure 6C:
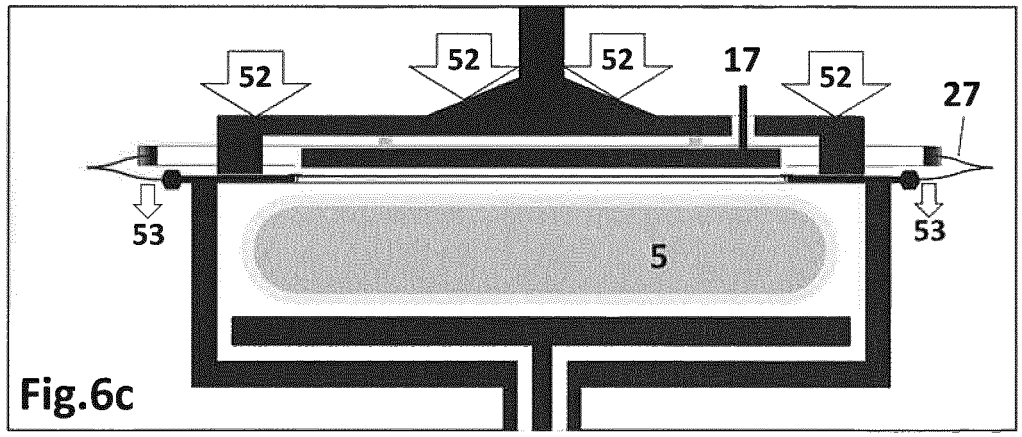

As illustrated in FIGS. 5a and 5b and in FIGS. 6a, 6b and 6c, during use, the first and second parts 601, 602 of the reactive vessel 100 are moved apart. The substrate 11 is provided on the substrate carrier 13 and the substrate carrier 13 is positioned between the first and second parts 601, 602 of the reactive vessel 100. FIGS. 6a to 6b illustrate the positioning of the substrate carrier 13 in the chamber 32 that is arranged for coating the upper side of the substrate 11. The substrate carrier 13 is positioned along the horizontal (arrow 49 in FIG. 5a) so that it is aligned and preferably centred, under the first electrode 2 and beneath the second and third electrodes 8, 16.

It will be understood that the substrate carrier 13 may be positioned manually or automatically using any suitable positioning means; for example using a chain, carriage or transportation fork (not shown) which will facilitate the user when positioning the substrate carrier 13. These transmission elements 14 may be held by the user when positioning the substrate carrier 13 or alternatively the transmission elements 14 may be connected to a chain which is driven by an actuator or other automatic driven transporting means to allow for automatic positioning of the substrate carrier 13.

Once the substrate carrier 13 is positioned so that it is aligned and preferably centred, under the first electrode 2 and beneath the second and third electrodes 8, 16, the second part 602 of the reactive vessel 100 is moved towards the first part 601 so as to clamp the substrate carrier 13 between the first and second parts 601, 602, thereby defining a semi tight plasma reactive volume 32 in which the plasma is confined. Specifically the substrate carrier 13 is clamped between the second electrode 8 and the housing 603 in which the first electrode 2 is housed. Since the substrate carrier 13 comprises electrically conductive material, the housing 603 is thus electrically connected to the second electrode 8 by means of the substrate carrier 13.

The positioned first and second parts 601, 602 are then preferably secured during a complete plasma process sequence.

The advantages of having a first and second parts 601, 602 of the reactive vessel 100 which move relative to one another is that the first and second parts 601, 602 can be moved to mechanically contact the substrate carrier 13 and the second electrode 8, to defining precisely a predefined first clearance gap 12. Furthermore, moving the first and second parts 601, 602 together closes the plasma reactor volume 32 allowing it to operate in a plasma box regime. Also when the first and second parts 601, 602 have been moved together to clamp the substrate carrier 13 and contact the second electrode 8, this ensures that the reactive vessel 100, the substrate carrier 13 and the back plate 8 are all electrically grounded.

In the example illustrated in FIGS. 6a, 6b and 6c, the positioning means may comprise a spring element 27 (represented by a flat spring) mechanically connected to the substrate carrier 13 and to a fixed part 26 of the positioning means. The fixed part is shown as a frame 26. The spring element 27 allows the substrate holder 14 to move and adjust vertically under the force transmitted by the second electrode 8. The spring element 27 further maintains the substrate carrier 13 in a position centered between the first part 601 and the second part 602, when the first and second parts 601, 602 are moved apart. FIG. 6c represents the reactor vessel 100 of FIGS. 6a and 6b upside down. The configuration of FIG. 6c can be used for exposing the lower surface 40b (see FIG. 3) of substrate 11 to the plasma.

It should be noted that the height of the ceramic holding blocs 22, 23 and the depth of the recess 112 are chosen such that when the first and second parts 601, 602 are brought together to the vacuum chamber 30, the first clearance gap 12 is equal to a predefined value.

Next, as shown in FIGS. 6b and 6c, plasma 5 is provided into the plasma chamber 32. The power source 33 is used to applying a main RF voltage to the first electrode 2; this main RF voltage charges the plasma 5 in the plasma reactor volume 32 which causes plasma deposition on the upper surface 40a (see FIG. 3) of the substrate 11. The charged plasma 5 induces by capacitive effect, a voltage on the upper surface 40a of the substrate 11.

At the same time the power source 33 is used to apply a main RF voltage to the first electrode 2, the compensating device 18 is operated to provide the third electrode 16 with a compensating RF voltage $V_c$. The amplitude of the compensating RF voltage $V_c$ is between 10 to 100% of the main RF voltage, but the phase of compensating RF voltage $V_c$ is opposite to the phase of the voltage differential between the first and second electrodes 2 and 8.

With the main RF voltage applied to the first electrode 2 and the compensating voltage applied to the third electrode 16, the plasma 5 in the vacuum chamber 30 is then ignited and plasma deposition on the substrate 11 takes place.

The compensating RF voltage $V_c$ induces, by capacitance effect, a voltage on the lower surface 40b of the substrate 11 which cancels the voltage which is induced on the upper surface 40a of the substrate 11 by the charged plasma 5. The voltage induced on the lower surface 40b of the substrate 11 cancels off the effect of the series capacitance introduced by the clearance gap 12. As a consequence the upper surface 40a of the substrate 11 will have a resulting potential which is constant across the upper surface 40a of the substrate and is equal to the potential of the adjacent second electrode 8. As the potential across the upper surface 40a of the substrate 11 is constant, uniformly distributed plasma deposition across the upper surface 40a will occur.

For example, assuming that the second electrode 8 is grounded (zero voltage) and that the driving RF voltage delivered by the power source 33 on the first electrode 2 is $V_0$, and that the RF voltage between the plasma 5 and the second electrode 8 is $V_{RF}$, and further assuming that the plasma is quasi-symmetric, then the RF plasma voltage $V_{RF}$ will be approximately $V_{RF}=V_0/2$, a good estimate of the RF voltage across the sheath 6 (see FIGS. 1-3). The compensating RF voltage provided by the compensating device 18 to the third electrode 16 is $V_c$. The effective voltage $V_{eff}$ at the upper surface 40a of the substrate 11 is then:

$$V_{eff} = (V_{RF} - V_c) e_s / (e_s + e_g) \qquad \text{Eq. (3).}$$

By choosing a suitable value for $V_c$ the effective voltage $V_{eff}$ can be made equal to $V_{RF}$. The suitable value for $V_c$ which ensure that the effective voltage $V_{eff}$ is equal to $V_{RF}$ can be determined as:

$$V_c = -(e_g/e_s) V_{RF} \qquad \text{Equation (4),}$$

wherein $e_g$ is the first clearance gap 12 between the substrate 11 and the third electrode 16 and $e_s$ is the thickness of the plasma sheath 6.

The minus sign indicates that the phase will be opposite to the one of $V_{RF}$.

Recalling that the sheath thickness is ranging between 1 and 3 mm, the compensation voltage will be between 33% to 100% of the RF voltage $V_{RF}$ for a first clearance gap 12 of 1 mm, or between 66 to 200% for a first clearance gap 12 of 2 mm. As the RF voltage $V_{RF}$ is approximately half of the driving RF voltage $V_0$, the compensation voltage Vc will range between 16 to 100% of the main RF voltage delivered by the power source 33 when the first clearance gap 12 is kept between 1 and 2 mm.

Hence the compensation voltage Vc for the third electrode will remain of the order or less than the main RF voltage, preferably about one third of it.

Figure 4A:
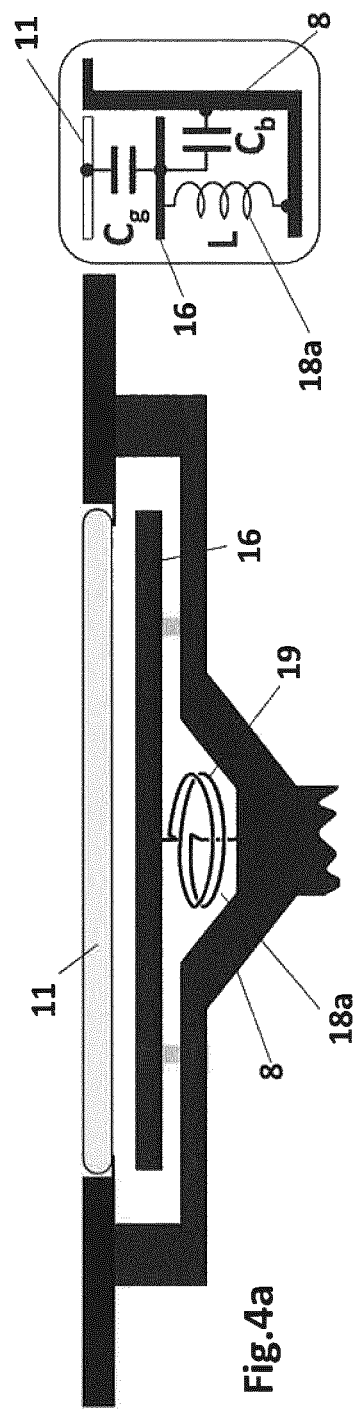
FIGS. 4a and b illustrate possible configurations for the compensating device used in the reactor vessel of FIG. 3.
Figure 4B:
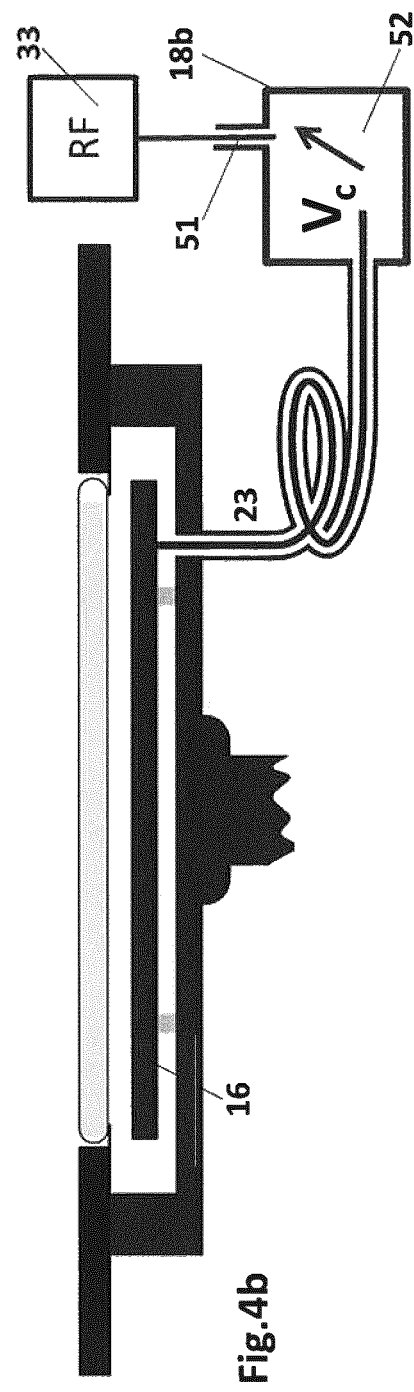

As mentioned the compensating device 18 may take any suitable configuration. Examples of two different suitable compensating devices 18a, 18b are shown in FIGS. 4a and 4b respectively. Each of the compensating devices 18a, 18b provides the compensating RF voltage $V_c$ to third electrode 16 in a different manner.

The compensating device 18a is essentially made of a self-inductance coil 19 which electrically connects the second electrode 8 to the third electrode 16. The equivalent electrical circuit representing, from the substrate 11 through the compensating device 18a to the third electrode 16, is also illustrated in FIG. 4a. The equivalent electrical circuit comprises a capacitance $C_g$ which is the capacitance between the third electrode 16 and the substrate accounting for the first clearance gap 12, and a capacitance $C_b$ accounting for the mutual capacitance between electrode 16 and the enclosing second electrode 8 which includes the contribution of the capacitance of the second clearance gap 21 plus the contributions of both the third electrode periphery and ceramic spacing elements 22, 23. It is easy to derive that such a system of impedance connecting substrate 13 to the second electrode 8 has a zero of net impedance at resonance when the following condition is met:

$$L(C_g + C_b)\overline{\omega}^2 = 1 \qquad \text{Equation (5),}$$

wherein $\overline{\omega}$ is the resonant frequency.

Zero impedance between the substrate 13 and electrode 8 means that both parts are at the same RF voltage. Thus, by providing a self-inductance coil 19 with the appropriate self-inductance L, where $\overline{\omega}$ is equal to the RF frequency, the self-inductance coil 19 will compensate for capacitance $C_g$ which results from the first clearance gap 12 between the substrate 11 and third electrode 16. Specifically by providing a self-inductance coil 19 which has a self-inductance L which is equal to $1/(C_g + C_b)\overline{\omega}^2$, where $\overline{\omega}$ is the driving RF frequency, the self-inductance coil 19 will provide the proper compensating voltage for eliminating the series impedance effect of capacitance $C_g$ which results from the first clearance gap 12 between the substrate 11 and third electrode 16.

One of the advantages of the compensating device 18a is the simplicity of the configuration; the compensating device 18a comprises a simple self-inductance coil 19 which can be made compact, using, for example, strip line technology.

FIG. 4b illustrates a further example of a compensating device 18. The compensating device 18b shown in FIG. 5b is an alternative to the self inductance based on a RF power inlet coming from the main generator 33. The compensating device 18b comprises a RF power inlet 51 where a fraction of RF power is extracted from the RF supply 33, and various adjustable circuits very similar to circuits found in classical RF match boxes. It comprises a voltage control means 52 which can be used to adjust the RF voltage which is output from the RF power source 51. It also comprises a means to invert and adjust the phase of the RF power fed via line 23 to the third electrode 16, as this can be done with classical transformers.

For proper adjustment of the compensation system, whether it is a self inductance as 18a or a subsidiary match box as 18b, it is recommended to calibrate the phase and amplitude of the compensation voltage. A good part of it can be done by calibration, mocking up the plasma with a metal block, with free spacing mocking the sheaths and as a mock up for the substrate, an insulating plane carrying a metallization pad on it. Then an RF probe can pick the voltage differential between the metal pad and the adjacent electrode 8. The adjustment consists in zeroing the probe differential signal. This technique is by far enough to adjust the amplitude and phase of Vc (for example to adjust the value of L). Fine tuning using real plasma and measurement of uniformity can be done afterward.

It will be understood that the compensating device 18 may take any other suitable configuration, other than the configurations shown in FIGS. 4a and 4b. For example, various circuits, passive or active are able to provide the third electrode 16 with a compensating RF voltage $V_c$. These various circuits may be configured to allow adjustment of both amplitude and phase of the compensating RF voltage $V_c$. However, regardless of its configuration, the compensating device 18 can be configured such that it can provide the third electrode 16 with a compensating RF voltage $V_c$ which is such that the substrate 11 and the adjacent second electrode 8 have the same RF voltage.

In the above reactor vessel 100 examples, the substrate carrier 13 was shown to be configured to hold a single substrate 11 above a single third electrode 16. FIGS. 7a to 7c illustrate a different carrier 113 and the corresponding back plate assembly 602 according to a further embodiment of the present invention. The top part of the reactor assembly 601 is the same as in FIG. 5a, it has many of the same features of the plasma reactor vessel 100 shown in FIG. 3 and like features are awarded the same reference numbers. However, the substrate carrier 813 can hold four substrates and the back plate assembly 602' below can be adapted to this modified geometry, in particular having a multiplicity of compensating electrodes 16 beneath the multiplicity of substrate.

In FIG. 7, the substrate carrier 813 comprises an electrically conductive material and is configured so that it can be electrically connected with the second electrode 8 when the substrate carrier 813 is positioned in the vacuum chamber 30. The substrate carrier 813 illustrated in FIG. 7a is shown to hold four substrates 811, such as four wafers. The substrate carrier 813 is configured to be removable from the vacuum chamber 30, to allow the substrates 811 to be mounted on the substrate carrier 813. The substrate carrier 813 holds each of the substrates 811 such that at least the majority of an upper 40a and opposite, lower surface 40b, of each substrate 811 are untouched by the substrate carrier 813 or any other part of the plasma reactor 100. In the example which is illustrated in FIG. 7a the substrate carrier 813 comprises a four cut-out portions 814 each of which preferably have an area which is greater than the area of a substrate 811 and which can receive a substrate 811. The manner in which each of the substrates 811 are held in a cut-out portion 814 is similar to what was described for an individual substrate in FIG. 3, with supports having contact with the substrate only at the very edge where the device to be deposited is not active. As illustrated in FIG. 7b, the substrate carrier 813 comprises support members 813a, 813b which extend into the cut-out portions 814. The substrates 811 rests on these support members 813a, 813b; the length of the support members 813a, 813b is such that they extend along non-active parts 811a, 811b of each substrate 811 only. Thus an active parts 811c of each substrate 811 remains untouched by the support members 813a, 813b or any other part of the plasma reactor 800. It will be understood that in an alternative embodiment the substrate carrier 813 will not comprise support members 813a, 813b and the cut-out portions 814 may each have an area which is slightly less than the area of a substrate 811 so that each substrate can rest directly on the substrate carrier 813 above a corresponding cut-out portion 814. Again, in this case it is most preferable that substrate carrier 813 contacts only the non-active parts 811a, 811b of each substrate 811.

In FIGS. 7a and 7b, the corresponding back plate assembly 602' further comprises four third electrodes 816, corresponding to the four cut-out portions 814 provided in the substrate carrier 813. Each of the four third electrodes 816 is electrically connected to a compensating device. Each of the four third electrodes 816 is positioned between the substrate carrier 813 and the second electrode 8 and the substrate carrier 813 may be arranged such that each of its cut-out portions 814 are aligned over a corresponding third electrode 816. Thus each substrate 811 held by the substrate carrier 813 can be aligned over a corresponding third electrode 816. As was the case in the plasma reactor vessel 100, each of the third electrodes 816 are positioned such that there is a first clearance gap 12 between each third electrode 816 and substrate 811. The first clearance gap 12 ensures that each substrate 811 is untouched by its corresponding third electrode 816. Preferably the first clearance gap 12 between each substrate 811 and its corresponding third electrode 816 is about 1 mm.

In FIG. 7b, the second electrode 8 further comprises a post 25' located towards the centre of the second electrode 8. During use, when the substrate carrier 813 is brought into electrical contact with the second electrode 8, a center of the substrate carrier 813 will rest on the post 25'. The post 25' will provide structural support to substrate carrier 813 so as to prevent the substrate 811 from warping under its own weight This ensures that a uniform distance between each of the substrates 811 and its corresponding third electrodes 816 is maintained.

Although substrate carrier 813 is shown comprising four cut-out portions 814 and corresponding four third electrodes 816, it should be understood that the substrate carrier 813 may comprise any number of cut-out portions 814 and corresponding any number of third electrodes 816.

FIG. 7c illustrates a simpler design for a carrier accepting a multiplicity of substrates. In that case the third electrode 16 is a single monolithic plate covering the ensemble of the substrate area and the adjacent parts of the substrate carrier such as 13a and 13b. This design is preferable for its simplicity as long as the planarity of the substrate carrier 13 can be preserved.

Figure 8B:
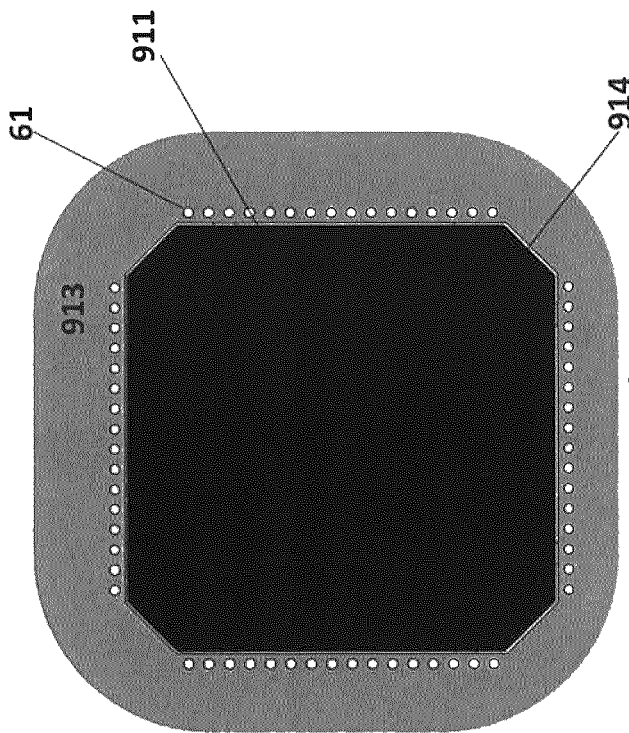
FIGS. 8a-c show various configurations for the substrate carrier used in a reactor vessel according to the present invention.
Figure 8A:
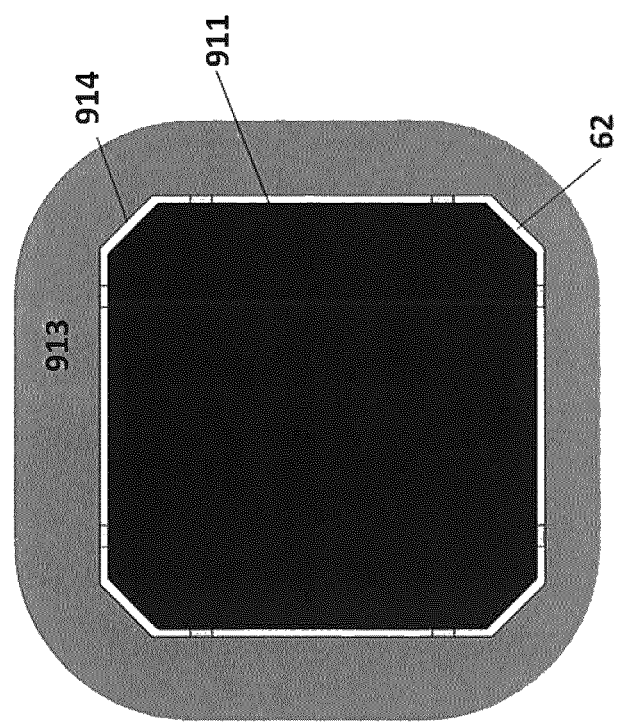
Figure 8C:
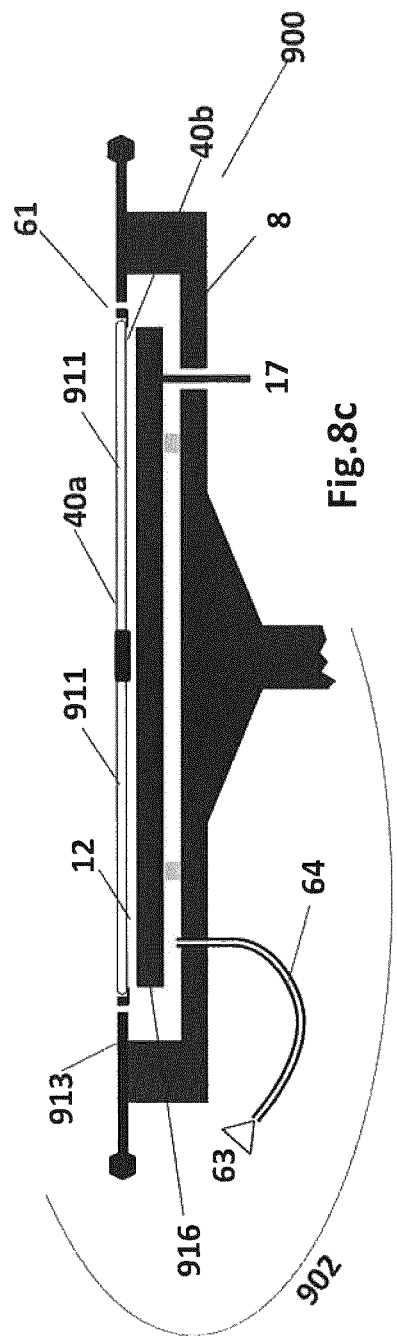

For example, FIG. 8c illustrate a cross section view of plasma reactor vessel 900 in which has a substrate carrier 913 which comprises four cut-out portions 914 each of which can receive a substrate. Instead of providing a corresponding number of third electrodes, the reactor vessel 900 comprises a single third electrode 916 which is large enough to extend beneath all four of the cut-out portions 914. The single third electrode 916 is electrically connected to a compensating device 18. This design is sufficient if the mechanical flatness of both carrier 913 and back plate assembly 902 are sufficient to guaranty a good control of the first clearance gap 12 beneath all the substrates 811.

Installing and running a plasma process requires changing the gas pressure inside the plasma reactor vessel, first installing the process pressure, then pumping out at the end of the process. During the pressure changes there is a danger that a transient pressure differential develops between upper and lower surfaces of substrate(s); the transient pressure differential can lead to distortion of a very thin substrate. The substrate may warp to the extent that it touches a third electrode in the plasma reactor vessel. Or it may break. It is therefore desirable to limit the pressure differential between the upper and lower surfaces of the substrates.

To address this problem, it is favorable to allow gas communication between the two volumes within the plasma vessel reactor facing the upper and lower surfaces of the substrate; for example in the embodiment illustrated in FIG. 8a, because the area of the cut-out portion 914 in the substrate carrier 913 is configured to be larger than substrate 911, a gap 62 is provided between the periphery of each substrate 911 and the part of the substrate carrier 813 which define the cut-out portion. Most preferably, area of the cut-out portion 914 is such that the gap 62 is equal to or less than 1 mm, preferably around 0.8 mm. The gap 62 will permit gas to pass between the volumes in plasma vessel reactor facing the upper and lower surfaces of the substrate. Thus, there will be no pressure differential between the areas in plasma vessel reactor in which the upper and lower surfaces occupy.

An alternative solution is illustrated in FIG. 8b. In FIG. 8b the substrate carrier 913 comprises a cut-out portion which does not provide sufficient communication for gas at the periphery of substrate 911. To allow gas exchange between the two volumes in plasma vessel reactor facing the upper and lower surfaces of the substrate, the substrate carrier 913 comprise a plurality of holes 61 which allow gas to pass through the substrate carrier 913 and thus allow gas exchange between the areas in plasma vessel reactor in which the upper and lower surfaces occupy. Preferably the diameter of each of the holes is less than 1 mm. Preferably more than thirty holes 61 are provided in the substrate carrier 913.

Keeping the same pressure at the upper and lower surfaces of the substrate(s) and processing the exposed surface of the substrate at the reactive place on one face 40a implies that the volume behind the substrate enclose in assembly 902 and covered by the carrier 913 and the substrate(s) 911 form a close volume in diffusive communication with the activated gases from the plasma volume 30. Moreover, in some particular PECVD processes, the ambient gas may contain unstable species leading to secondary contamination by the gas phase of the lower surface of the substrate; this may occur commonly in the doped layer deposition processes.

In order to limit such secondary contamination, a conduit 64 may be provided which is arranged to provide a flow of inactive gas across the lower surface 40b of the substrate(s), as shown in FIG. 8c. In the example shown in FIG. 8c the conduit 64 is passed through the second electrode 8. A gas supply 63 is connected to the conduit 64, and it provides inactive gas which flows through the conduit, and across the lower surface 40b of the substrate(s). The flow of inactive gas will limit the accumulation of process gas on the lower surface 40b of the substrate(s) and will also rinse the area below the lower surface 40b.

It should be noted that the flow of inactive gas over the lower surface 40b of the substrate(s) is only needed when the processing atmosphere within the plasma reactor vessel is baring a risk of spurious deposition which would lead to secondary contamination of the lower surface 40b of the substrate(s) (as it would be the case during PECVD process with Boron hydrides). For cases where the plasma reactor vessel may not require a gas supply 63 and conduit 64, instead the plasma volume 821 may either stay in static volume or allowed to communicate with the outer vacuum volume 30.

Figure 9:
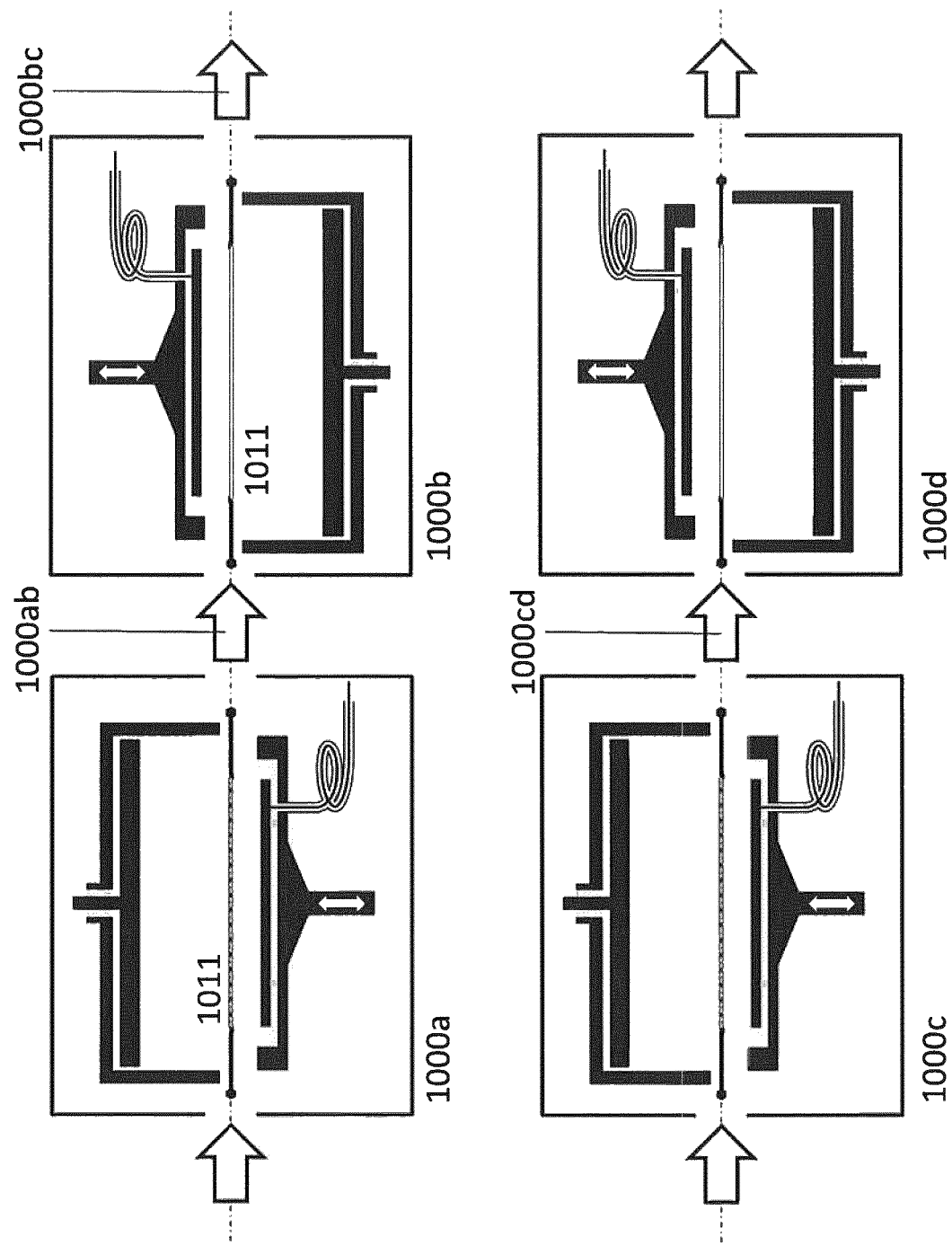
FIG. 9 illustrates a fraction of a system assembly, in the form of a processing line, according to a further aspect of the present invention.

Typically any of the above-mentioned plasma reactor vessels may be used to form a production assembly. FIG. 9 illustrates an example of an assembly according to the present invention; the assembly defines a production line which comprises four vacuum vessels 1000a-d. A substrate 1011 is transported successively to each of the four plasma reactive vessels 1000a-d. Two of the vessels are represented equipped with PECVD reactors, the vessel 1000a with a reactor coating the substrate downward, the next vessel 1000c with a reactor coating the other face of the substrate, namely upward. Typically the substrate 1011 is transported successively to each of the vessels 1000a-d according to arrows 100ab-bc-cd, by means of a carriage or some other suitable automatic transporting means.

In the example of FIG. 9, the four vessels 1000a-d are placed is series as it would be in a classical in-line vacuum processing system. It will be easily understood by specialists that the same concept of sequential processing can be designed in a cluster type processing system architecture. In FIG. 9, the reactor 1000c has a configuration which is the inverse of the configuration of the preceding plasma reactive vessel 1000b. In other words, in a first plasma reactive vessel 1000b the second and third electrodes 8, 16 are located below the lower surface 40b of the substrate 1011 and the first electrode 2 is located above the upper surface 40a of the substrate 1011. In the second plasma reactive vessel 1000b along the production line, the second and third electrodes 8, 16 are located above the upper surface 40a of the substrate 1011 and the first electrode 2 is located below the lower surface 40b of the substrate 1011. As a result of the inverted configuration of successive plasma reactive vessels, plasma deposition will take place on the upper surface 40a in the first plasma reactive vessel 1000a in the production line; on the lower surface 40b in the second plasma reactive vessel 1000b in the production line; on the upper surface 40a in the third plasma reactive vessel 1000c in the production line; and finally on the lower surface 40b in the fourth plasma reactive vessel 1000d in the production line. It should be noted that a first substrate 10011 is seen pre-positioned in the reactor of chamber 1000b, while the preceding substrate in the coating production sequence is seen prepositioned in the next chamber 1000c.

The assembly is not limited to the exemplary configuration of FIG. 9 but can further comprises any combination of vessels such as to be able to perform any arbitrary sequence of processes. For example, the assembly can comprise a number of vessels different from four. The plurality of vessels can be arranged so that the substrate 1011, when transported from a vessel to another, can be processed in any possible combination of process steps. For example, the substrate 1011 can be processed sequentially upwardly and downwardly, several times upwardly (or downwardly) and then downwardly (or upwardly). For example, the substrate 1011 can be transported successively to the successive process modules including the plasma reactive vessels 1000b-c which are represented equipped with PECVD reactors, the vessel 1000b with a reactor coating the substrate downward, the next vessel 1000c with a reactor coating the other face of the substrate, namely upward. Typically the substrate 1011 is transported successively to each of the vessels 1000a-d by means of a carriage or some other suitable automatic transporting means. The plurality of vessels can also be arranged such that the combination of process steps comprises a combination of PECVD process steps and other process steps such as load-lock, heating, cooling, substrate flipping, plasma etching, plasma cleaning and PVD deposition such as evaporation or sputtering and reactive sputtering.

As alternative to the above-mentioned production line, each of the plasma reactive vessels 1000a-d may have all the same configuration, and a means for flipping the substrate 1011 may be provided. The means for flipping the substrate 1011 will be operated to flip the substrate 1011 between successive plasma reactive vessels 1000a-d so that plasma deposition can take place on the upper and lower surfaces 40a, 40b of the substrate 1011 successively, at each plasma reactive vessels 1000a-d along the production line.

It should be noted that it is most preferable to connect each of the four plasma reactive vessels 1000a-d by means of vacuum passages, along which the substrate 1011 can be passed. That way the substrate can be maintained in a vacuum environment as it is passed between the four plasma reactive vessels 1000a-d. Typically the substrate (or the set of substrates) will be held in a single substrate carrier 1013 and that substrate carrier, which holds the substrate 1011, will be passed to the four reactive vessels 1000a-d successively.

The concept of the present invention is addressing specific devices where both sides of a substrate should contribute to the activity of a photo-electronic device. For example the present invention could be used in the manufacture of hetero-junction cells, or in the manufacture of power rectifiers.

The invention claimed is:

1. Plasma reactor vessel, comprising
a vacuum chamber;
a first electrode in the vacuum chamber;
a second electrode in the vacuum chamber, opposed to the first electrode and spaced from the first electrode;
a means for providing reactive process gases in the vacuum chamber;
a power source electrically connected to one of the first or second electrodes, for applying a main RF voltage to one of the first and second electrodes, the other electrode being grounded;
a substrate carrier comprising an electrically conductive material, the substrate carrier being configured to be in electrical contact with the second electrode and to hold a substrate such that at least the majority of upper and lower surfaces of the substrate are untouched by any part of the plasma reactor and can be exposed to the plasma;

the reactor vessel further comprising a third electrode beneath the substrate carrier and between the substrate carrier and the second electrode, wherein the third electrode is electrically insulated from said second electrode; and wherein the third electrode and the substrate carrier are arranged such that, when the substrate carrier holds a substrate, a first clearance gap is comprised between the substrate and the third electrode.

2. Plasma reactor vessel according to claim 1 further comprising a compensating device configured to provide a compensating RF voltage to the third electrode, the compensation RF voltage having a modulation phase opposite to the modulation phase of the RF voltage differential between the first electrode and the second electrode.

3. The reactor according to claim 2, wherein the first clearance gap between the third electrode and substrate is between 0.5 mm and 3 mm.

4. The reactor according to claim 1, further comprising a second clearance gap beneath the third electrode and between the third electrode and said second electrode, the second clearance gap electrically insulating the third electrode from said second electrodes.

5. The reactor according to claim 2, wherein said compensating device comprises a voltage source which can generate an RF signal, and the third electrode is electrically connected to the voltage source via a feed line.

6. The reactor according to claim 2, wherein said compensating device comprises a coiled self-inductance electrically connecting said second electrode to the third electrode.

7. The reactor according to claim 1, further comprising insulating spacing elements between the third electrode and said second electrode, the magnitude of the second clearance gap being determined by the height of the insulating spacing elements.

8. The reactor according to claim 7, wherein said insulating spacing elements comprise ceramic blocks.

9. The reactor according to claim 1, wherein said substrate carrier is configured to hold a plurality of the substrates.

10. The reactor according to claim 9, wherein the substrate carrier comprises a plurality of cut-out portions, each cut-out portion being adapted to receive a substrate.

11. The reactor according to claim 10, the reactor vessel comprises a plurality of the third electrodes, each of said plurality of the third electrode being aligned with a corresponding cut-out portion in the substrate carrier.

* * * * *